United States Patent [19]

Tateishi et al.

[11] Patent Number: 4,853,102
[45] Date of Patent: Aug. 1, 1989

[54] SPUTTERING PROCESS AND AN APPARATUS FOR CARRYING OUT THE SAME

[75] Inventors: Hideki Tateishi, Yokohama; Hiroshi Saito, Fujisawa; Shinji Sasaki, Yokohama; Mitsuaki Horiuchi, Hachioji, all of Japan

[73] Assignee: Hitachi, Ltd., Tokyo, Japan

[21] Appl. No.: 137,562

[22] Filed: Dec. 24, 1987

[30] Foreign Application Priority Data

Jan. 7, 1987 [JP] Japan ............................ 62-363
Mar. 11, 1987 [JP] Japan ............................ 62-54005
Apr. 1, 1987 [JP] Japan ............................ 62-77419

[51] Int. Cl.$^4$ ............................................ C23C 14/00
[52] U.S. Cl. ...................................... 204/298; 204/298
[58] Field of Search ......... 204/298 ME, 298 C, 192.1, 204/298 PM, 298 SC, 298 MC

[56] References Cited

U.S. PATENT DOCUMENTS

| | | | |
|---|---|---|---|
| 3,325,394 | 6/1967 | Kay et al. ................... | 204/298 ME |
| 4,025,410 | 5/1977 | Stewart ...................... | 204/298 ME |
| 4,588,343 | 5/1986 | Garrett ...................... | 414/221 |
| 4,605,469 | 8/1986 | Shih et al. .................. | 414/222 |
| 4,670,126 | 6/1987 | Messer et al. ............... | 204/298 |
| 4,721,553 | 1/1988 | Saito et al. ................ | 204/298 ME |

*Primary Examiner*—John F. Niebling
*Assistant Examiner*—Steven P. Marquis
*Attorney, Agent, or Firm*—Kenyon & Kenyon

[57] ABSTRACT

A sputtering process and an apparatus for carrying out the same for forming a film of a film forming material over the surface of a substrate. A target formed of the film forming material is held on a sputtering electrode receiving a voltage, and the substrate is disposed at a predetermined distance and opposite to the target. A high-density plasma is produced by producing a cusp field between the target and the substrate and a bias voltage is applied to the surface of the substrate to make ions of the high-density plasma fall on the surface of the substrate in order to make the particles of the film forming material sputtered from the target deposit in a thin film over the surface of the substrate.

24 Claims, 7 Drawing Sheets

SPUTTERING PROCESS AND AN APPARATUS FOR CARRYING OUT THE SAME

BACKGROUND OF THE INVENTION

The present invention relates to a sputtering process for forming a thin film and, more particularly, to a sputtering process capable of satisfactorily coating minute stepped parts, minute grooves and minute holes in the surface of a substrate for a highly integrated multilayer semiconductor device having minute wirings, and an apparatus carrying out the method.

Japanese Patent Provisional Publication No. 60-221563 discloses a bias sputtering apparatus designed to apply a strong magnetic field to a plasma to increase current flowing into the substrate on which a film is to be formed. That is, in this bias sputtering apparatus, an objective substrate is disposed opposite to a magnetron sputtering electrode, and part of the ions in a plasma generated on the magnetron sputtering electrode is caused to flow into the surface of the substrate by applying a negative bias voltage to the surface of the substrate.

U.S. Pat. No. 3,325,394 discloses a sputtering technique employing a cusp field. According to this technique, an objective substrate is disposed opposite to a sputtering electrode, and a cusp field is produced between the objective substrate and the sputtering electrode by two sets of electromagnets to increase the density of the plasma and to increase the film forming speed. Since a magnetron sputtering process, which was disclosed after the sputtering process employing a cusp field, is simpler in the construction of the apparatus for carrying out the same and more effective than the sputtering process employing a cusp field for increasing the film forming speed, no attention has been paid to the use of a cusp field.

In the bias sputtering process, a negative bias voltage is applied to the surface of a substrate while a film forming material is deposited over the surface of the substrate in order that ions of a plasma fall on the surface of the substrate to give the energy of the ions to the particles of the film forming material in order to enhance the movement of the particles of the film forming material over the surface of the substrate so that the spread of the particles of the film forming material over the surfaces of grooves and holes formed in the substrate is improved. Accordingly, it is essential to increase an ionic current flowing into the substrate by increasing the quantity of ions which fall on the substrate, which can be attained by increasing the plasma density on the substrate, or by increasing the bias voltage.

Since the conventional magnetron sputtering electrode retains a plasma on the surface thereof facing the substrate, plasma density on the surface of the substrate cannot be increased to a sufficiently high degree simply by applying a bias voltage to the surface of the substrate. Our preliminary experiments showed that the intensity of ionic current flowing into the substrate was on the order of 0.5 A/125 diam., plasma density on the substrate was on the order of $2 \times 10^{10}/cm^{-3}$ and the spread of the film forming material (aluminum) over the surface of a square hole of 1.0 $\mu$m square and 1.0 $\mu$m in depth.

As generally known, the quantity of Ar gas absorbed by the film formed by sputtering increases with bias voltage.

It was also found through our preliminary experiments that voids and blisters appear in a film formed by sputtering using a high bias voltage on the order of 140V or above, when the film is subjected to annealing after sputtering.

SUMMARY OF THE INVENTION

Accordingly, it is a principal object of the present invention to provide a sputtering process and an apparatus for carrying out the same capable of making the particles of a film forming material spread over and adhere to the surfaces of minute stepped parts, minute grooves and minute holes formed in a substrate by applying a low bias voltage which will not cause faults such as blisters in the film to the substrate and capable of forming a thin film of a satisfactory quality.

To achieve the object of the invention, the present invention provides a sputtering process employing a bias sputtering method, in which a bias voltage is applied to an electrode connected to a substrate, in combination with a cusp field for increasing the density of plasma on the surface of the substrate.

According to the present invention, a sputtering electrode and a substrate electrode are disposed opposite to each other and a cusp field is produced between the sputtering electrode and the substrate electrode to generate a high-density plasma on the surface of the sputtering electrode through the vicinity of the surface of a substrate connected to the substrate electrode, and a negative bias voltage of a level not causing faults in a thin film formed over the surface of the substrate is applied to the substrate to increase the ionic current flowing into the substrate by attracting ions contained in the plasma in a high ion density to the substrate. Consequently, the migration of the particles of a film forming material over the surface of the substrate is enhanced and thereby particles temporarily adhering to the upper corners of stepped parts, grooves and holes spread over and adhere to the lower portions of the stepped parts, the bottoms of the grooves and the inner surfaces of the holes for connecting the multi-layers of a Large Scale Integrated device (LSI device). Thus, the present invention improves the spread of the particles of the film forming material over the surfaces of stepped parts, grooves and holes without entailing the deterioration of the thin film.

Furthermore, according to the present invention, the bias voltage can be determined independently of the generation of a high-density plasma and hence the incident ion energy on the substrate can be controlled maintaining the intensity of the ionic current flowing into the substrate substantially on a fixed level.

Still further, the present invention provides a sputtering process and an apparatus for carrying out the same, in which a cusp field is produced in a vacuum chamber between a substrate and a target, a high-density plasma is generated on the surface of the target through the vicinity of the surface of the substrate, the surface of the substrate is maintained at a negative potential by applying a DC bias voltage or a high-frequency power to the surface of the substrate, and the substrate is gas-cooled at a predetermined temperature by a temperature control means to prevent the excessive rise in the temperature of the substrate.

A high-density plasma is produced between the sputtering electrode and a region in the vicinity of the surface of the substrate by the agency of a cusp field. A negative bias voltage or the equivalent which will not cause defects in a film formed over the surface of the substrate is applied to the substrate independently of the cusp field to attract high-density ions in the plasma to the substrate, so that an increased ionic current flows into the substrate and the migration of the particles of the film forming material over the surface of the substrate is enhanced. Consequently, the spread of the particles of the film forming material over the surfaces of stepped parts, grooves and holes on the substrate is improved. Furthermore, the control of the substrate at a predetermined temperature enables forming a film of a fixed quality.

Moreover, according to the present invention, a cusp field is produced by magnetic devices respectively provided on the side of the target and on the side of the substrate to confine the plasma between the target electrode and the substrate electrode disposed opposite to the target electrode, and magnetic lines of force produced by the magnetic device on the side of the substrate are guided to the circumference of the substrate so that the same magnetic lines of force will not extend across the central portion of the substrate in order to prevent excessive rise in the temperature rise in the central portion of the substrate due to the concentration of high-energy electrons on the central portion of the substrate, to make ions fall uniformly on the substrate, to form a film of uniform quality, and to make the migration of the particles of the film forming material over the entire surface of the substrate uniform.

That is, the target electrode and the substrate electrode are disposed opposite to each other, a cusp field is produced between the target electrode and the substrate electrode by the magnetic devices respectively disposed on the side of the target and on the side of the substrate to confine a plasma between the target electrode and the substrate electrode, magnetic lines of force produced by the magnetic device on the side of the substrate are guided to the circumference of the substrate so that the same magnetic lines of force will not extend across the central portion of the substrate to restrain magnetic lines of force produced by the magnetic device on the side of the target on the target so as to extend along the surface of the target by the magnetic lines of force produced by the magnetic device on the side of the substrate in order to confine the high-density plasma within a wide area on the target. Since the magnetic lines of force produced by the magnetic device on the side of the substrate and retaining the magnetic lines of force produced by the magnetic device on the side of the target are guided to the circumference of the substrate and do not extend across the central portion of the substrate, electrons of the plasma confined on the target are not concentrated on the central portion of the substrate. The plasma thus confined on the target causes the target to sputter in the wide area thereof, so that the availability of the target is improved, a film is formed at a high film forming rate and a film having a satisfactorily uniform thickness is obtained.

DETAILED DESCRIPTION OF THE PREFERRED EMBODIMENT

Figure 1:
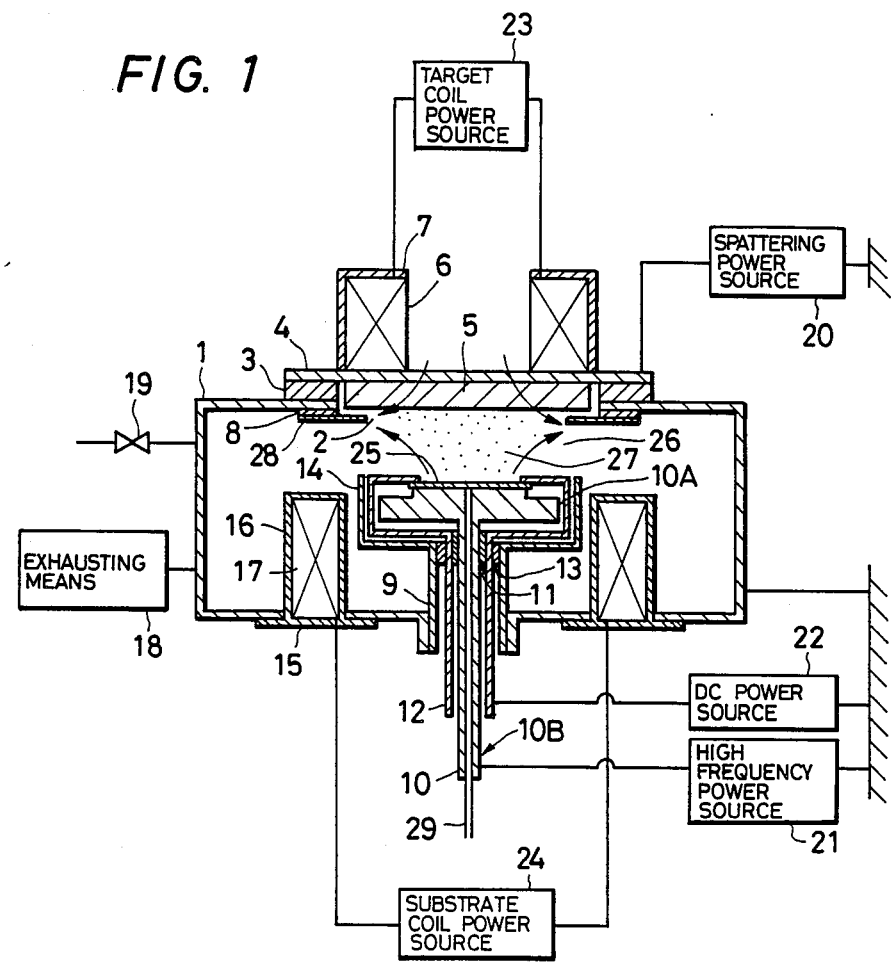
FIG. 1 is a schematic longitudinal sectional view of a sputtering apparatus, in a first embodiment, according to the present invention.

Referring to FIG. 1 showing a sputtering apparatus, in a first embodiment, according to the present invention, a sputtering electrode 4 is attached to an insulating member 3 so as to be positioned in an opening 2 formed in the upper wall of a vacuum chamber 1. A target 5 formed of a film forming material is attached to the lower surface, namely, a surface facing the interior of the vacuum chamber 1, of the sputtering electrode 4, and a target coil 6 and a yoke 7 enclosing the coil 6 are attached to the upper surface, namely, a surface facing the exterior of the vacuum chamber 1, of the sputtering electrode 4. The target coil 6 is connected to a target coil power source 23. The sputtering electrode 4 is connected to a sputtering power source 20. An anode 28 is disposed around the target 5 with a gap which will prevent discharge from the target 5. The anode 28 is secured through an insulator 8 to the vacuum chamber 1. The potential of the anode 28 is set selectively for floating potential, ground potential, an optional positive voltage or an optional negative voltage.

A substrate electrode 10 for supporting a substrate 25 is disposed in the lower opening 9 of the vacuum chamber 1 opposite to and at a suitable distance from the target 5. The substrate electrode 10 comprises a substrate supporting table 10A for supporting the substrate 25 thereon, and a stem 10B extending downward from the substrate supporting table 10A. A substrate holder 12 encloses the substrate electrode 10 through a sealing insulator 11 capable of vacuum-sealing function so as to hold the substrate 25 in the periphery thereof. The substrate holder 12 can be moved in direction perpendicular to the surface of the substrate 25, namely, in vertical directions as viewed in FIG. 1, by moving means, not shown. The substrate holder 12 is enclosed through a sealing insulator 13 capable of vacuum-sealing function in shield 14 fixedly fitted in the lower opening 9 of the vacuum chamber 1. A substrate coil 17 is contained hermetically in a coil container 16 fixedly fitted in a lower opening 15 formed in the lower wall of the vacuum chamber 1 and is connected to a substrate coil power source 24. The substrate electrode 10 and the substrate holder 12 are connected to a high-frequency power source 21 and a DC power source 22 respectively. When only a DC bias voltage is to be applied to the surface of the substrate 25, the high-frequency power source 21 can be omitted. When only a high-frequency bias voltage is to be applied to the substrate 25, the DC power source 22 can be omitted. When a high-frequency bias voltage is to be applied to the substrate, the substrate holder 12 is formed of an insulating material to shield a high-frequency plasma.

An inert gas such as Ar gas is supplied into the vacuum chamber 1 by a gas supply system 19. The vacuum chamber 1 is evacuated by an evacuating system 18 to maintain the internal pressure of the vacuum chamber 1 at about $10^{-3}$ torr.

A temperature control system for cooling the substrate 25 comprises a gas supply pipe 29 inserted through a through hole formed coaxially through the stem 10B of the substrate electrode 10 and through the central portion of the substrate holding table 10A of the substrate electrode 10, a gas supply device, not shown, for supplying a cooling gas the same as that filling the vacuum chamber 1, namely, an inert gas such as Ar gas, through the gas supply pipe 29 into the vacuum chamber 1, and a temperature regulator, not shown, for regulating the temperature of the cooling gas.

Figure 2:
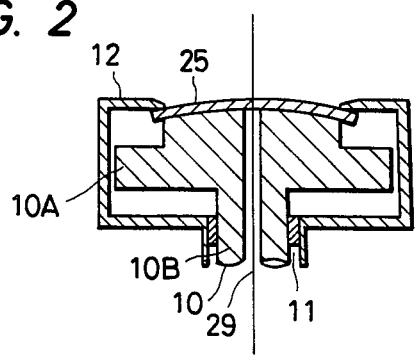
FIG. 2 is a schematic fragmentary sectional view showing the substrate supporting table of a substrate electrode employed in the sputtering apparatus of FIG. 1.

Referring to FIG. 2 showing the construction of the substrate holding table 10A of the substrate electrode 10, the substrate supporting table 10A has a gently convex surface, more explicitly, a spherical surface, convex toward the substrate 25 supported thereon so that the substrate 25 is mounted contiguously with the convex surface on the substrate supporting table 10A. That is, the substrate 25 needs to be warped properly beforehand so that the substrate 25 is held contiguously with the surface of the substrate holding table 10A, because the cooling gas supplied through the gas supply pipe 29 is blown against the lower surface of the substrate 25 held in the periphery thereof by the substrate holder 12 on the substrate holding table 10A while the upper surface of the substrate 25 is exposed to the interior of the vacuum chamber 1 evacuated to a vacuum on the order of $10^{-3}$ torr and hence the substrate 25 tends to be warped by about 100 $\mu$m in the central portion thereof when the cooling gas is blown against the lower surface of the substrate 25 and, on the other hand, it is necessary to place the substrate 25 closely on the substrate electrode 10 with a gap of 10 $\mu$m or less to maintain the rate of heat transfer between the substrate 25 and the substrate electrode 10. Therefore, the closed contact between the substrate 25 and the substrate electrode 10 can maintain by forming the surface of the substrate holding table 10A to a convex surface.

The functions of the sputtering apparatus thus constructed will be described hereinafter.

The substrate 25 to be subjected to a sputtering process is put into the vacuum chamber 1 through an entrance, not shown formed in the vacuum chamber, and is mounted on the substrate supporting table 10A. In mounting the substrate 25 on the substrate supporting table 10A, the substrate holder 12 is separated from the substrate supporting table 10A toward the target 5. After the substrate 25 has been mounted on the substrate supporting table 12A in place, a substrate holder moving mechanism, not shown, moves the substrate holder 12 toward the substrate 25 to bring the substrate holder 12 into engagement with the periphery of the substrate 25 to hold the same on the substrate supporting table 10A. Then, after evacuating the vacuum chamber 1 to a high vacuum by the evacuating system 18, Ar gas is supplied into the vacuum chamber 1 by the gas supply system 19 and through the gas supply pipe 29 to maintain the interior of the vacuum chamber at a sputtering pressure on the order of $10^{-3}$ torr. The target coil power source 23 and the substrate coil power source 24 supply coil currents to the target coil 6 and the substrate coil 17, respectively, so that magnetic fields of opposite polarities are produced by the target coil 6 and the substrate coil 17, respectively. Consequently, a cusp field as represented by magnetic lines of force 26 in FIG. 1 is produced. Then, the sputtering power source 20 applies a sputtering voltage to the sputtering electrode 4, and thereby a high-density plasma 27 is produced in a space defined by the magnetic lines of force 26 between the surface of the target 5 and the surface of the substrate 25. Then, the DC power source 22 applies a DC bias voltage through the substrate holder 12 to the surface of the substrate 25 to maintain the surface of the substrate 25 at a negative bias potential or the high-frequency power source 21 supplies a high-frequency power to the substrate electrode 10 to maintain the surface of the substrate 25 at the negative bias potential by producing a high-frequency plasma and raising the negative bias potential on the surface of the substrate 25, in order to cause ions in the plasma 27 to low into the substrate 25. Tho substrate 25 is held at a predetermined temperature by the AR gas supplied through the gas supply pipe 29.

Since the high-density plasma is caused to prevail near the substrate 25 by the agency of the cusp field 27, an ionic current sufficient to make the particles of the film forming material migrate satisfactorily in stepped parts, grooves and holes formed in the substrate 25 is produced at a low bias voltage which will not cause defects in the film.

Figure 3:
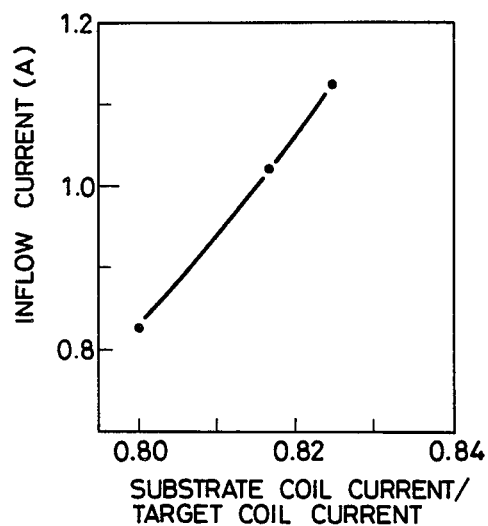
FIG. 3 is a graph showing the variation of inflow current on a substrate with the coil current ratio of substrate coil current to target coil current in the sputtering apparatus of FIG. 1.

The variation of current flowing into the substrate 25 with the coil current ratio of substrate coil current to target coil current was measured, in which the bias voltage applied to the substrate 25 was $-100$V and the distance between the substrate 25 and the target 5 was 50 mm. Measured results are shown in FIG. 3. When the coil current ratio was small, the center diameter of the plasma ring was greater than the diameter of the substrate. The center diameter of the plasma ring can be reduced to a value equal to the diameter of the substrate 25 by increasing the coil current ratio. The plasma density was $1 \times 10^{11}/cm^{-3}$, which is approximately five times the plasma density obtained by the conventional technique, and the current flowing into the substrate 25 in an area of 125 mm in diameter was 1.1A, which was approximately twice the current obtained by the conventional technique.

Aluminum films were formed over the surfaces of minute holes formed in the substrate 25 through a bias sputtering process by the sputtering apparatus, in which the current flowing into the substrate 25 was varied. The SEM photographs of films were examined to evaluate the migration of aluminum particles over the surfaces of the minute holes. The results of the examination are tabulated in Table 1. When ionic current density was 1 A/125 mm diam., aluminum particles migrated satisfactorily over the surface of a minute hole of 1.0 $\mu$m square.

TABLE 1

| Size of holes (μm square) | Migrating characteristics Ionic current density (A/125 mm diam.) | | |
|---|---|---|---|
| | 0 | 0.5 | 1.0 |
| 2.0 | O | O | O |
| 1.5 | x | O | O |
| 1.0 | x | x | O |

Figure 4:
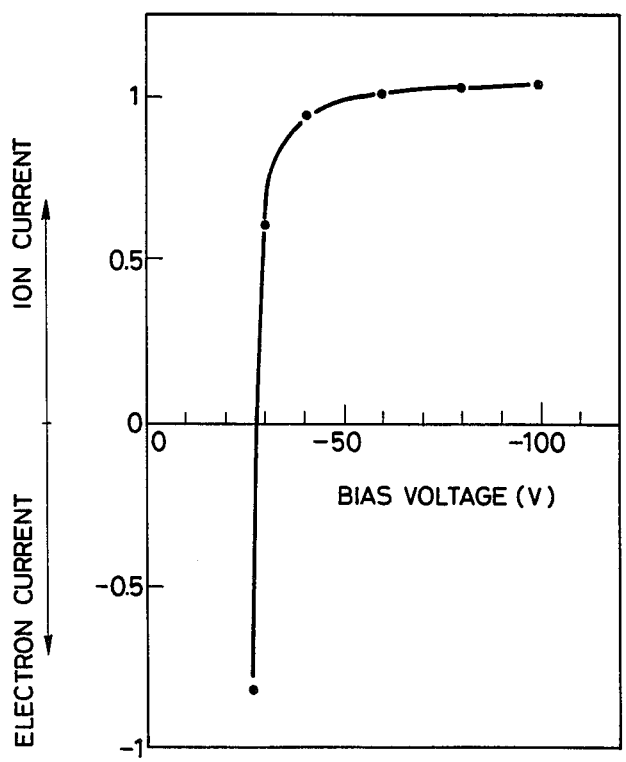
FIG. 4 is a graph showing the variation of inflow current on a substrate with bias voltage applied to the substrate.

FIG. 4 shows the relation between bias voltage applied to the substrate 25 and current flowing into the substrate 25 measured in the sputtering operation of the sputtering apparatus, in which the distance between the substrate 25 and the target 5 was 50 mm. As obvious from FIG. 4, the current flowing into the substrate 25 remained substantially constant regardless of the variation of the bias voltage from −100V to −40V. That is, the total quantity of ion energy entering the substrate 25 can be regulated over a wide range maintaining the ionic current flowing into the substrate 25 substantially at a fixed level.

As obvious from the foregoing description, since a high ionic current can be supplied to the substrate 25 by applying a low bias voltage to the substrate 25, a film can be formed satisfactorily in stepped parts, grooves and holes without causing defects such as voids and blisters in the film. Furthermore, since the bias voltage can be determined independently of the generation of a high-density plasma, the ion energy can be regulated to increase the flexibility in controlling the quality of the film maintaining the quantities of ions substantially at a fixed value.

The results of sputtering operation of the sputtering apparatus in the first embodiment of the present invention for forming aluminum films will be described hereinafter with reference to FIGS. 5 and 6.

Figure 5:
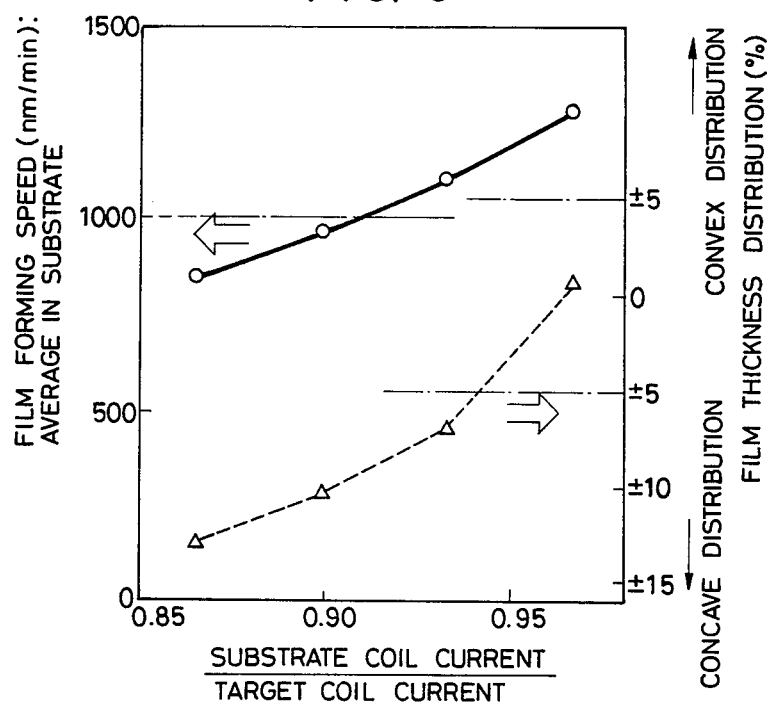
FIG. 5 is a graph showing the film forming characteristics of the sputtering apparatus of FIG. 1.

In FIG. 5, the coil current ratio of substrate coil current to target coil current is measured on the horizontal axis, and film forming speed (mm/min) (full line) and film thickness distribution (%) (dotted line) are measured on the vertical axis. As obvious from FIG. 5, when the coil current ratio is increased, the magnetic lines of force 26 of the cusp field are curved toward the target 5 and the area of a region covered with the plasma on the target 5 decreases gradually from an area having a diameter greater than that of the substrate 25, the film forming speed increases, and the film thickness distribution changes from a concave distribution in which the film thickness is small in the central portion of the substrate 25 and is large in the peripheral portion of the same, to a convex distribution in which the film thickness is large in the central portion of the substrate 25 and is small in the peripheral portion of the same. Suppose that a target film forming speed is 1000 mm/min or above and a target film thickness distribution is ±5% or below. Then, a coil current ratio meeting such conditions is 0.95 or above.

Figure 6:
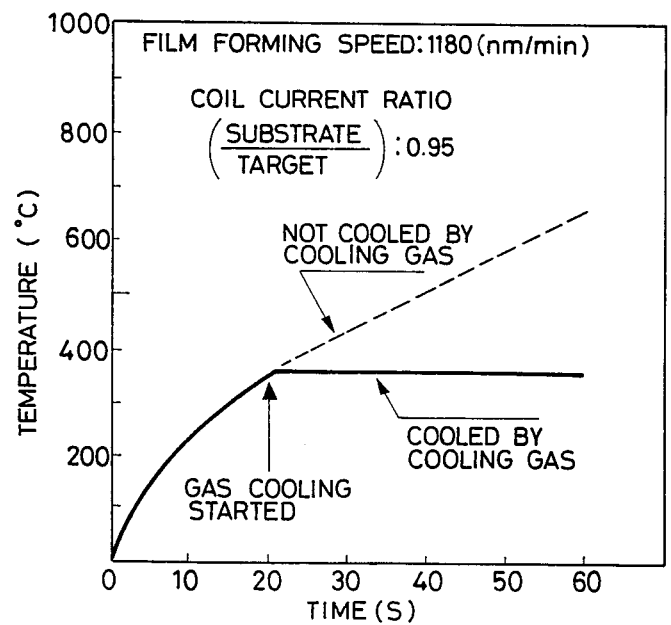
FIG. 6 is a graph showing the variation of the temperature of a substrate with time.

FIG. 6 shows the temperature characteristics of the substrate 25 when the film forming speed is 1180 mm/min and the coil current ratio is 0.95, in which a time (sec) elapsed after the start of the sputtering operation is measured on the horizontal axis and the temperature (°C.) is measured on the vertical axis. In 20 sec after the start of the sputtering operation, the temperature of the substrate 25 rises to 350° C. If the substrate 25 is not cooled under the control of the temperature control system, the temperature of the substrate 25 will keep rising up to 650° C. in 60 sec after the start of the sputtering operation as indicated by a dotted line. Since the melting point of aluminum is about 650° C., part of an aluminum film formed over the surface of the substrate 25 will melt at such a high temperature. When the temperature control system starts cooling operation at a time 20 sec after the start of the sputtering operation to cool the substrate 25 by the cooling gas, the substrate 25 is maintained at about 350° C. even at a time 60 sec after the start of the sputtering operation. Thus, the particles of the film forming material are caused to migrate satisfactorily over the surfaces of stepped parts, grooves and holes formed in the surface of the substrate 25, damages in the film by the ions and excessive rise in temperature of the substrate 25 are prevented and a film of high quality can be formed at a low bias voltage which will not cause defects in the film to the substrate by producing a high-density plasma so as to prevail in the vicinity of the surface of the substrate 25 cooling the substrate 25 by the cooling gas.

Although electromagnets respectively having the target coil 6 and the substrate coil 17 are employed as means for producing a magnetic field in this embodiment, means for producing a magnetic field is not limited thereto, but permanent magnets capable of producing an equivalent magnetic field may be employed. Moreover, although the temperature control system of this embodiment is means for cooling the substrate 25, the temperature control system need not be limited to cooling means, but may be heating means for heating the substrate by a heating gas during the sputtering operation to maintain the substrate electrode 10 at an appropriately high temperature when the film forming speed is low and the thermal input of the substrate 25 is small. Maintaining the substrate 25 at an appropriate temperature further improves the quality of the film.

Figure 7:
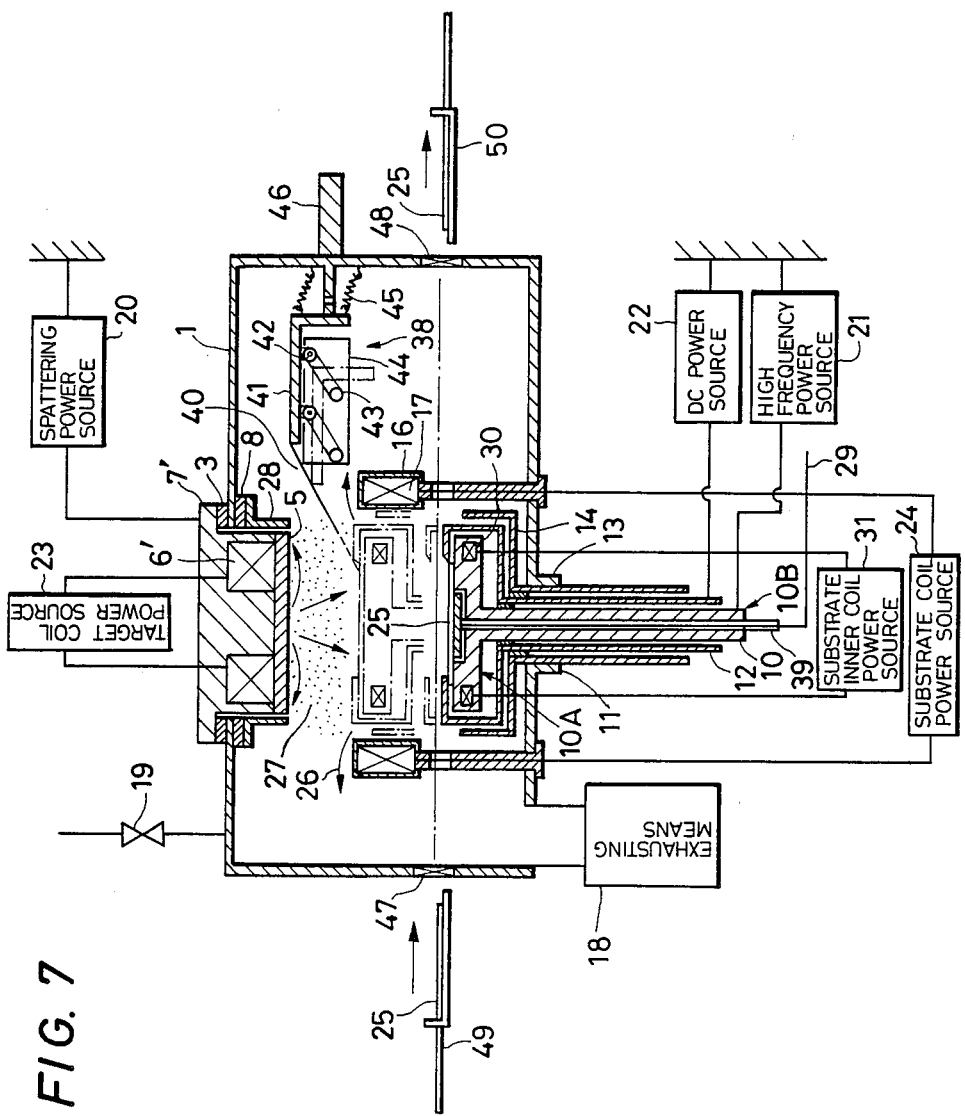
FIG. 7 is a schematic longitudinal sectional view of a sputtering apparatus, in a second embodiment, according to the present invention.
Figure 8:
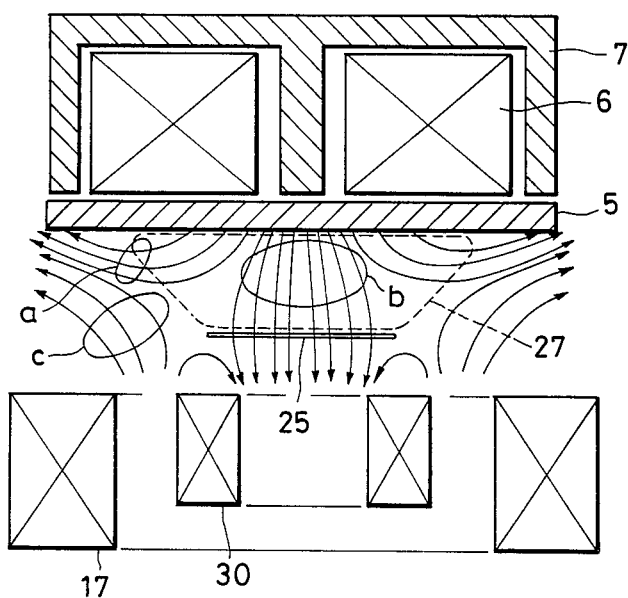
FIG. 8 is a diagrammatic illustration showing the distribution of magnetic lines of force between a substrate and a target in the sputtering apparatus of FIG. 7.

A sputtering apparatus, in a second embodiment, according to the present invention will be described hereinafter with reference to FIGS. 7 through 9, in which parts corresponding to those previously described with reference to FIGS. 1 through 8 are denoted by the same reference numerals and the description thereof will be omitted.

A target coil 6' and a yoke 7' for producing a magnetic field is mounted on a target electrode 4 in a surface exposed to the exterior of a vacuum chamber 1. A substrate coil 30 is received in a substrate electrode 10 and is connected to a substrate coil power source 31.

A substrate electrode 10 for supporting a substrate 25 is disposed opposite to the target electrode 4. The substrate electrode 10 can be shifted between a substrate transfer position indicated by full lines in FIG. 7 and a processing position indicated by alternate long and short dash lines in FIG. 7 by an electrode shifting cylinder 10B. The substrate electrode 10 has a substrate elevating member 39 for vertically moving the substrate 25. A cooling gas supply pipe 29 is extended through the substrate elevating member 39 to supply a cooling fluid for cooling the substrate 25 between the substrate 25 and a substrate supporting table 10A. The substrate electrode 10 is provided also with a built-in inner substrate coil 30 in the substrate supporting table 10A. An outer substrate coil 17 is disposed at a position corresponding to the processing position of the substrate electrode 10. When the substrate electrode 10 is at the processing position, the inner substrate coil 30, the outer substrate coil 17 and the target coil 6' produce a cusp field.

A bias voltage applying unit 38 for applying a bias voltage to the substrate 25 is disposed on the right-hand side of the processing position of the substrate supporting table 10A of the substrate electrode 10 to apply a bias voltage to the substrate 25 positioned at the processing position. The bias voltage applying unit 38 comprises a contact member 40 with which the substrate 25 is brought into contact, a base member 41 supporting the contact member 40, rollers 42 supported on the base member 41, a guide plate 44 having guide grooves 43 respectively for guiding the rollers 42, a spring 45 biasing the base plate 41 to the right as viewed in FIG. 7, and a power cylinder 46 for pushing the base plate 41 to the left as viewed in FIG. 7 so that the base plate 41 is moved obliquely downward.

The substrate 25 is conveyed into the vacuum chamber 1 through an entrance gate 47 provided on one side wall of the vacuum chamber 1 by a conveying device 49 and is conveyed outside the vacuum chamber through an exit gate 48 provided on another side wall of the vacuum chamber 1 by a conveying device 50.

When only a DC bias voltage is applied to the substrate 25, the high-frequency power source 21 shown in FIG. 7 may be omitted. The DC power source 22 shown in FIG. 7 may be omitted when only a high-frequency bias voltage is applied to the substrate 25. When a high-frequency bias voltage is applied to the substrate 25, a substrate holder 12 is formed of an insulating material to shield a high-frequency plasma.

The target coil 6 and the target coil power source 23 for producing a magnetic field may be substituted by an equivalent permanent magnet.

The manner of operation of the sputtering apparatus in the second embodiment will be described hereinafter.

The conveying device 49 conveys the substrate 25 through the entrance gate 47 into the vacuum chamber 1 to a position corresponding to the center of the substrate electrode 10. Then, the elevating member 39 is raised to receive the substrate 25 from the conveying device 49. Then, the conveying device 49 is retracted, the elevating member 39 is lowered to mount the substrate 25 on the substrate supporting table 10A, and then the substrate holder 12 holds the substrate 25 on the substrate supporting table 10A.

Then, an electrode driving cylinder, not shown, is actuated to raise the substrate electrode 10 to the processing position and the entrance gate 47 is closed. The evacuating device 18 is operated at an evacuating rate in relation to the flow rate of a gas supplied through the gas supply pipe to maintain the internal pressure of the vacuum chamber, typically, at a pressure on the order of 0.1 Pa. Then, the target coil 6' and the inner substrate coil 30 are energized to produce magnetic fields of the same polarity, and the outer substrate coil 17 is energized to produce a magnetic field of a polarity opposite the polarity of the magnetic fields produced by the target coil 6' and the inner substrate coil 30 in order to produce a resultant magnetic field indicated by magnetic lines of force 26 as shown in FIG. 7.

Then, a sputtering power is applied to the target electrode 7' to produce a plasma 27 between the target electrode 7' and the substrate electrode 10. Consequently, the target 5 of a film forming material sputters particles, and then the particles of the film forming material deposit over the surface of the substrate 25 in a thin film of a predetermined thickness. Then, the power cylinder 46 is actuated to push the base plate 41 and thereby the base plate 41 is moved obliquely downward to the left as the rollers 42 move along the guide grooves 43 to bring the contact member 40 into contact with the substrate 25. Then, a DC bias voltage is applied to the substrate 25 for a secondary bias sputtering process.

A high-frequency power is supplied to the substrate supporting table 10A of the substrate electrode 10 to induce a high-frequency self-bias voltage on the surface of the substrate 25. In such a case, the bias voltage applying unit 38 need not be provided.

FIG. 8 illustrates calculated magnetic lines of force 26 obtained through a simulation, in which the respective central magnetic flux densities of the target coil 6, the inner coil 30 and the outer coil 17 were 338G, 230G and 250G. Magnetic lines of force magnetic flux among those (a and b) extending from the fore end of the central core of the yoke 7 of the target coil 6 are curved so as to extend along the surface of the target 5 under the influence of magnetic flux c generating from between the inner coil 30 and the outer coil 17. Magnetic lines of force b extending from the free end of the central core of the yoke 7 reach the inner coil 30. Then, the target power source 20 supplies a sputtering power to the target electrode 4 to produce a high-density plasma confined by the magnetic lines of force a and c extending perpendicularly to the direction of the electric field between the target 5 and the surface of the substrate supporting table 10A of the substrate electrode 10. It was found through observation that the density of the plasma is higher in a region in which the magnetic lines of force a extend than in a region in which the magnetic lines of force b extend. The target 5 is caused to produce a large number of secondary electrons mainly by ions supplied from the plasma in the region of the magnetic lines of force a, and then the secondary electrons are accelerated at a high rate and discharged into the plasma by the agency of the potential difference of several hundreds volts between the target 5 and the plasma. The electrons having a high energy move helically along the magnetic lines of force a and c. Since the magnetic lines of force a are convexly curved with respect to the surface of the target 5, the electrons other than those lost by collision are confined by the magnetic lines of force a. Electrons discharged into the magnetic lines of force c travel along the magnetic lines of force c toward the substrate 25. However, since the magnetic lines of force c are deviated from the substrate 25 and pass across the circumference of the substrate 25, electrons having a high energy never fall on the substrate 25. On the other hand, most of the electrons discharged into the magnetic lines of force b are high-energy electrons diffused by the collision with ions and neutral particles and hence the speed of those electrons are reduced to a sufficiently low speed. The low-speed electrons travel along the magnetic lines of force b toward the substrate 25. Since the magnetic lines of force b extending from a sufficiently small area in the target 5 are distributed uniformly over the surface of the substrate 25 in a uniform magnetic flux density, the electrons are distributed uniformly over the surface of the substrate 25. Furthermore, since the distribution of magnetic flux density over the surface of the substrate 25 is uniform, ions contained in the plasma 27 and traveling along the magnetic lines of force b fall on the surface of the substrate 25 in a uniform distribution. Still further, since the magnetic lines of force a are caused to collect near the surface of the target 5 by the magnetic lines of force c, a high-density plasma is formed in a wide region.

Figure 9:
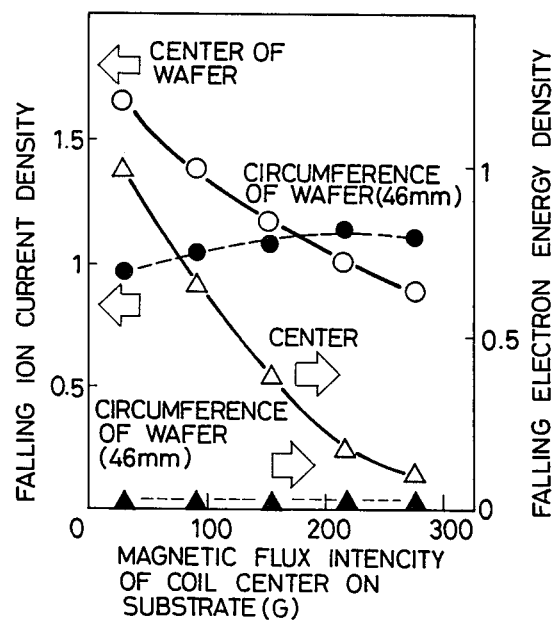
FIG. 9 is a graph showing inflow ionic current density on a substrate and inflow electron energy density on a substrate with the center magnetic flux density of a substrate coil.

FIG. 9 shows the variation of ionic current flowing into the substrate 25 and electron energy density on the substrate 25 with the central magnetic flux density of the inner coil 30, in which the bias voltage applied to the substrate 25 is −100V and the respective central magnetic flux densities of the target coil 6 and the outer coil 17 are 338G and 248G. When the magnetic flux density of the inner coil 30 is zero, a magnetic field the same as a cusp field is produced. As the central magnetic flux density of the inner coil 30 is increased, the concentration of ions on the central portion of the substrate 25 is reduced, ions fall in a uniform distribution on the substrate 25 and no high-energy electron falls on the substrate 25 when the magnetic flux density of the inner coil 30 exceeds 260G. A temperature regulating gas is introduced between the substrate supporting table 10A of the substrate electrode 10 and the substrate 25 held thereon to regulate the temperature of the substrate 25 at an appropriate temperature for forming a thin film of satisfactory quality.

Thus, abnormal temperature rise in the central portion of the substrate and irregular migration of the particles of the film forming material over the surfaces of minute stepped parts and minute holes attributable to the maldistribution of ions on the surface of the substrate, which are liable to occur in the conventional cusp field bias sputtering process, are obviated, a film is formed at a high film forming speed, a film having a uniform quality can be formed and the particles of the film forming material are caused to migrate satisfactorily over the surface of the substrate.

Figure 10:
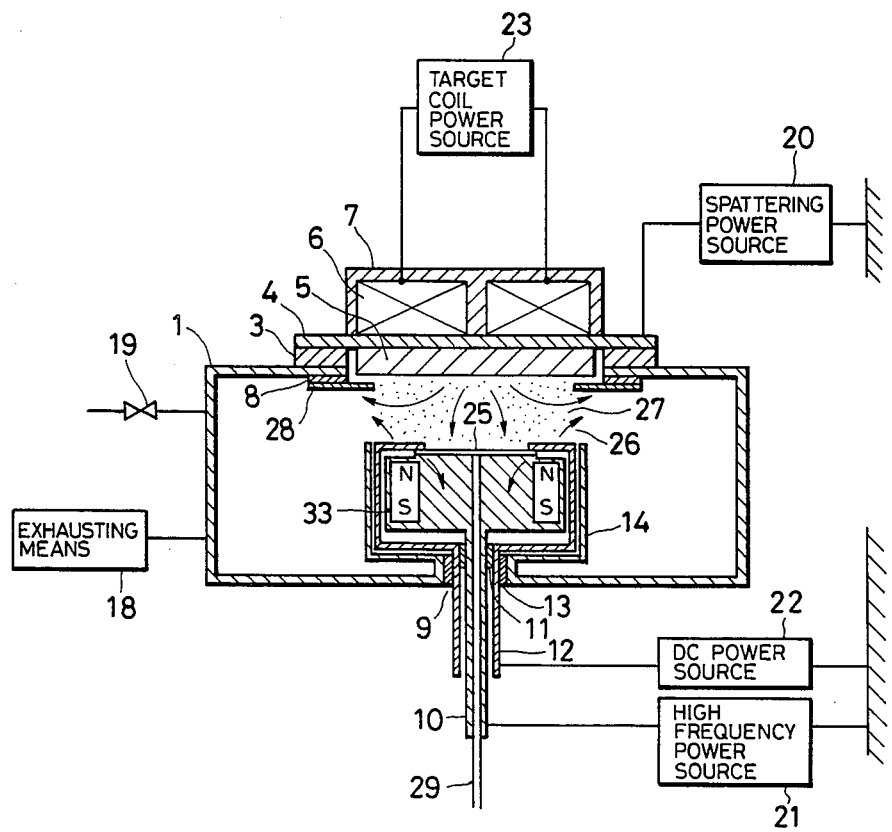
FIG. 10 is a schematic longitudinal sectional view of a sputtering apparatus, in a third embodiment, according to the present invention.

FIG. 10 shows a sputtering apparatus, in a third embodiment, according to the present invention. The third embodiment is the same in construction as the second embodiment except means for producing a magnetic field. The third embodiment employs an annular permanent magnet 33 instead of the inner coil 30 and the outer coil 17 of the second embodiment. The permanent magnet 33 has an inside diameter greater than that of the substrate and is disposed at the back of the substrate 25. The external magnetic lines of force of the permanent magnet 33 produce a cusp field in cooperation with the magnetic lines of force of a target coil 6. The internal magnetic lines of force of the permannent magnet 33 are distributed similarly to and provide the same effect as that provided by those shown in FIG. 8.

The present invention will be described hereinafter with reference to FIG. 7 as applied to a sputter etching apparatus.

Referring to FIG. 7, a sputter etching apparatus has an electrode 4 corresponding to a first electrode. During the sputter etching process, the electrode 4 is maintained at a ground potential or a floating potential. A high-frequency power is applied to a substrate electrode 10 to produce a plasma 28. The bias voltage applying unit 15 is not necessary for the sputter etching process. The rest of the components of the sputter etching apparatus are the same as those of the foregoing embodiment.

The substrate electrode 10 mounted with a substrate 25 is moved to a processing position, and then a high-frequency power is applied to the substrate electrode 10 to produce the high-density plasma 27. A self-bias voltage is induced in the surface of the substrate 25 and thereby ions contained in the high-density plasma 27 fall uniformly in a high density on the surface of the substrate 25 to carry out the sputter etching process uniformly at a high speed. If necessary, a cooling gas is supplied through the cooling gas supply pipe 29 between the substrate and the substrate electrode 10 to cool the substrate 25.

Figure 11:
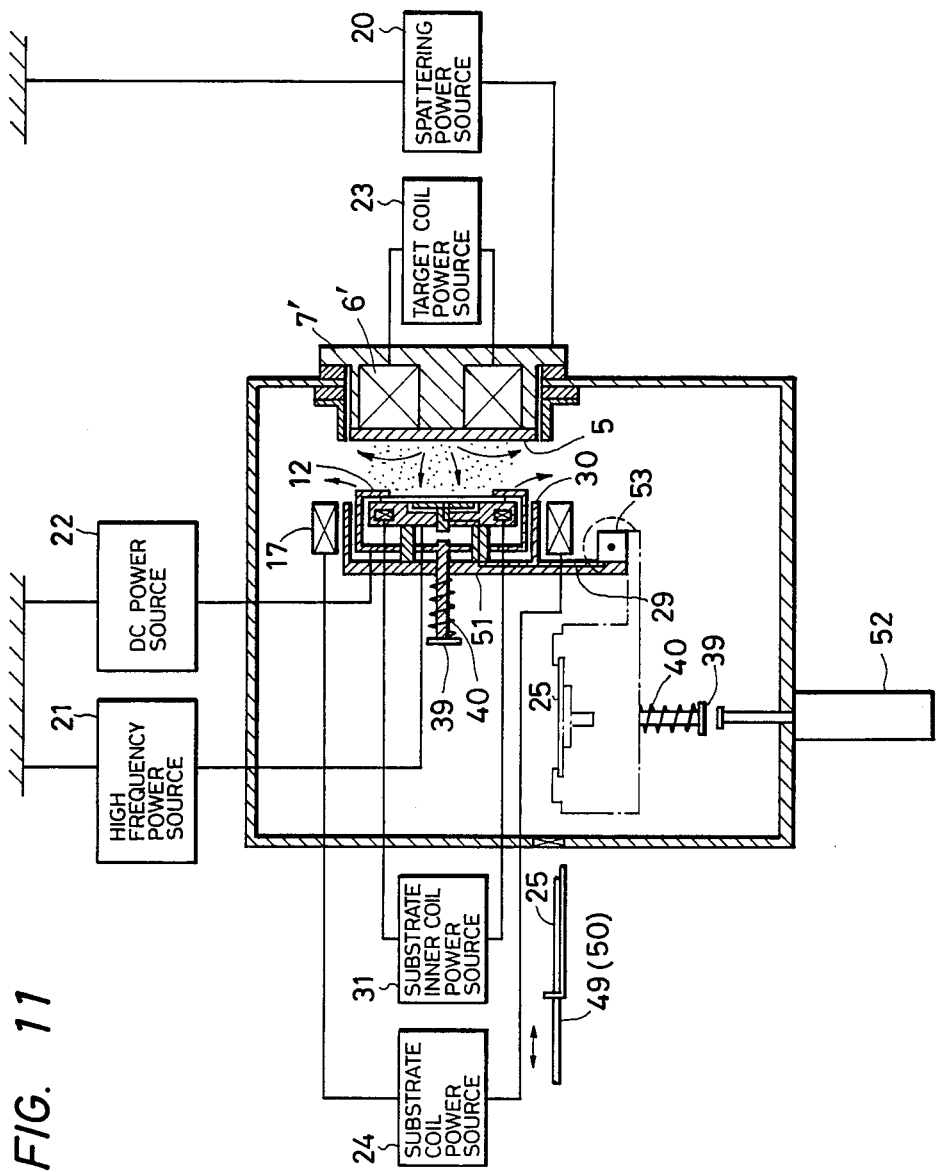
FIG. 11 is a schematic longitudinal sectional view of a sputtering apparatus, in a fourth embodiment, according to the present invention.

A sputtering apparatus, in a fourth embodiment, according to the present invention will be described hereinafter with reference to FIG. 11. The fourth embodiment is substantially the same in construction and function as the second embodiment shown in FIG. 7, except the position of a substrate during the sputtering process. In FIG. 11, parts corresponding to those previously described with reference to FIG. 7 are denoted by the same reference numerals and the description thereof will be omitted.

In the second embodiment, the substrate is disposed in a horizontal position during the sputtering process, while the substrate is disposed in a vertical position in the fourth embodiment.

Referring to FIG. 11, the substrate electrode 10 is mounted on an arm 51 attached at one end thereof to a rotary shaft 53. The substrate electrode 10 is turned on the rotary shaft 53 between a processing position indicated by full lines and a transfer position indicated by alternate long and short dash line in FIG. 11. The substrate 25 is held on the substrate electrode 10 with a substrate holder 12. The elevating member 39 is biased always to the left as viewed in a position indicated by full lines in FIG. 11 by a spring 40. When the substrate electrode 10 is located at the transfer position, a power cylinder 52 pushes the elevating member 39 to transfer the substrate 25 from a conveying device 49 to the substrate electrode 10 or to transfer the substrate 25 from the substrate electrode 10 to a conveying device 50.

Obviously, the sputtering apparatus shown in FIG. 11 can be applied to a sputter etching process.

What is claimed is:

1. A sputtering apparatus that includes a vacuum chamber for holding an inert gas comprises:
   first means for holding a target comprising film forming material wherein said target is disposed on a first side of said first means and wherein said first means comprises a cathode electrode;
   an anode electrode;
   second means, connected to said cathode electrode and said anode electrode, for generating an electric field;
   third means for producing a first magnetic field, wherein said third means comprises a target magnetic device disposed on a second side of said first means, opposite to said first side;
   fourth means for supporting a substrate wherein said fourth means comprises a supporting electrode;
   fifth means for producing a cusp magnetic field along the perimeter of said substrate in conjunction with said first magnetic field, wherein said fifth means comprises an outer magnetic device disposed around said fourth means; and
   sixth means for producing a central magentic field distributed substantially uniformly over a first surface of the substrate in conjunction with said first magnetic field, wherein said sixth means comprises an inner magnet disposed beneath said substrate.

2. The sputtering apparatus of claim 1 further comprising a seventh means for supplying a DC voltage to said first surface of said substrate wherein said seventh means comprises a bias voltage source.

3. A sputtering apparatus according to claim 2 wherein said means for inducing further comprises means for providing contact with the surface film of the substrate means for moving said means for providing contact along a guide.

4. The sputtering apparatus of claim 1 further comprising means for inducing a negative DC voltage on said first surface of said substrate wherein said means for inducing a negative DC voltage comprises a source of a high frequency voltage connected to said supporting electrode.

5. The sputtering apparatus of claim 1 further comprising means for controlling a temperature of said substrate.

6. A sputtering apparatus according to claim 1, wherein said outer magnetic device comprises a permanent magnet.

7. A sputtering apparatus according to claim 1, wherein said outer magnetic device comprises an electromagnet.

8. A sputtering apparatus according to claim 7, wherein said outer magnetic device further provides a yoke disposed in a space surrounded by the electromagnet.

9. A sputtering apparatus according to claim 1, wherein said inner magnetic device comprises a permanent magnet.

10. A sputtering apparatus according to claim 1, wherein said inner magnetic device comprises an electromagnet.

11. A sputtering apparatus according to claim 1, further comprising:
means for maintaining said cathode electrode at a ground or floating potential, said means for maintaining comprising means for changing an electric power supplied by said second means to said cathode electrode whereby a sputter etching process can be obtained.

12. A sputtering apparatus according to claim 1, further comprising:
means for moving said substrate supporting electrode between a transfer position for mounting the substrate on said substrate supporting electrode and a processing position for subjecting the substrate to a sputtering process.

13. A sputtering apparatus according to claim 1, further comprising:
means for supplying a temperature controlling gas between the substrate supporting electrode and the substrate.

14. A sputtering apparatus that includes a vacuum chamber for holding an inert gas comprises:
first means for holding a target comprising film forming material wherein said target is disposed on a first side of said first means and wherein said first means comprises a cathode electrode;
an anode electrode;
second means, connected to said cathode electrode and said anode electrode, for generating an electric field;
third means for producing a first magnetic field, wherein said third means comprises a target magnetic device disposed on a second side of said first means, opposite to said first side;
fourth means for supporting a substrate wherein said fourth means comprises a supporting electrode;
fifth means for producing a cusp magnetic field along the perimeter of said substrate in conjunction with said first magnetic field, wherein said fifth means comprises an outer magnetic device disposed around said fourth means;
sixth means for producing a central magnetic field distributed substantially uniformly over a first surface of the substrate in conjunction with said first magnetic field, wherein said sixth means comprises an inner magnet disposed beneath said substrate;
a seventh means for supplying a DC voltage to said first surface of said substrate wherein said seventh means comprises a bias voltage source; and
means for controlling a temperature of said substrate.

15. A sputtering apparatus according to claim 14, further comprising:
means for maintaining said cathode electrode at a ground or floating potential, said means for maintaining comprising means for changing an electric power supplied by said second means to said cathode electrode whereby a sputter etching process can be obtained.

16. A sputtering apparatus according to claim 14, further comprising:
means for moving said substrate supporting electrode between a transfer position for mounting the substrate on said substrate supporting electrode and a processing position for subjecting the substrate to a sputtering process.

17. A sputtering apparatus according to claim 16, wherein said means of controlling a temperature of said substrate comprises:
means for supplying a temperature controlling gas between the substrate supporting electrode and the substrate.

18. A sputtering apparatus according to claim 14, wherein said means for inducing further comprises means for providing contact with a surface film of the substrate means for moving said means for providing contact along a guide.

19. A sputtering apparatus according to claim 14, wherein said means for controlling a temperature of said substrate comprises:
means for supplying a temperature controlling gas between the substrate supporting electrode and the substrate.

20. A sputtering apparatus that includes a vacuum chamber for holding an inert gas comprises:
first means for holding a target comprising film forming material wherein said target is disposed on a first side of said first means and wherein said first means comprises a cathode electrode;
an anode electrode;
second means, connected to said cathode electrode and said anode electrode, for generating an electric field;
third means for producing a first magnetic field, wherein said third means comprises a target magnetic device disposed on a second side of said first means, opposite to said first side;
fourth means for supporting a substrate wherein said fourth means comprises a supporting electrode;
fifth means for producing a cusp magnetic field along the perimeter of said substrate in conjunction with said first magnetic field, wherein said fifth means comprises an outer magnetic device disposed around said fourth means;
sixth means for producing a central magnetic field distributed substantially uniformly over a first surface of the substrate in conjunction with said first magnetic field, wherein said sixth means comprises an inner magnet disposed beneath said substrate;

means for inducing a negative DC voltage on said first surface of said substrate wherein said means for inducing a negative DC voltage comprises a source of a high frequency voltage connected to said supporting electrode; and means for controlling a temperature of said substrate.

21. A sputtering apparatus according to claim 20, further comprising:

means for maintaining said cathode electrode at a ground or floating potential, said means for maintaining comprising means for changing an electric power supplied by said second means to said cathode electrode whereby a sputter etching process can be obtained.

22. A sputtering apparatus according to claim 20, further comprising:

means for moving said substrate supporting electrode between a transfer position for mounting the substrate on said substrate supporting electrode and a processing position for subjecting the substrate to a sputtering process.

23. A sputtering apparatus according to claim 20, wherein said means for controlling a temperature of said substrate comprises:

means for supplying a temperature controlling gas between the substrate supporting electrode and the substrate.

24. A sputtering apparatus that includes a vacuum chamber for holding an inert gas comprises:

first means for holding a target comprising film forming material wherein said target is disposed on a first side of said first means and wherein said first means comprises a cathode electrode;

an anode electrode;

second means, connected to said cathode electrode and said anode electrode, for generating an electric field;

third means for producing a first magnetic field, wherein said third means comprises a target magnetic device disposed on a second side of said first means, opposite to said first side;

fourth means for supporting a substrate wherein said fourth means comprises a supporting electrode;

fifth means for producing a cusp magnetic field along the perimeter of said substrate in conjunction with said first magnetic field, wherein said fifth means comprises an outer magnetic device disposed around said fourth means;

sixth means for producing a central magnetic field distributed substantially uniformly over a first surface of the substrate in conjunction with said first magnetic field, wherein said sixth means comprises an inner magnet disposed beneath said substrate;

a seventh means for supplying a DC voltage to said first surface of said substrate wherein said seventh means comprises a bias voltage source;

means for controlling a temperature of said substrate comprising means for supplying a temperature controlling gas between the substrate supporting electrode and the substrate; and means for maintaining said cathode electrode at a ground or floating potential, said means for maintaining comprising means for changing an electric power supplied by said second means to said cathode electrode whereby a sputter etching process can be obtained.

* * * * *